US009006637B2

(12) United States Patent
Deleniv et al.

(10) Patent No.: US 9,006,637 B2
(45) Date of Patent: Apr. 14, 2015

(54) SCALABLE LARGE AREA PHOTO DETECTOR WITH ASYMMETRIC MICROSTRIP TRANSITION

(75) Inventors: Anatoli Deleniv, Mölndal (SE); Spartak Gevorgyan, Göteborg (SE); Arne Alping, Kållered (SE)

(73) Assignee: Optis Cellular Technology, LLC, Plano, TX (US)

( * ) Notice: Subject to any disclaimer, the term of this patent is extended or adjusted under 35 U.S.C. 154(b) by 877 days.

(21) Appl. No.: 13/128,776

(22) PCT Filed: Nov. 12, 2008

(86) PCT No.: PCT/EP2008/065342
§ 371 (c)(1),
(2), (4) Date: May 11, 2011

(87) PCT Pub. No.: WO2010/054685
PCT Pub. Date: May 20, 2010

(65) Prior Publication Data
US 2011/0215228 A1 Sep. 8, 2011

(51) Int. Cl.
*H01J 40/14* (2006.01)
*H01L 27/146* (2006.01)
(Continued)

(52) U.S. Cl.
CPC ...... *H01L 31/0224* (2013.01); *H01L 31/02016* (2013.01); *H01L 31/09* (2013.01)

(58) Field of Classification Search
CPC ........... H01J 40/14; G01J 1/4228; G01J 1/44; H01L 27/1446; H01L 27/1443; H01L 27/144; H01L 27/14643; H01L 31/105; H01L 31/109; H01L 27/14603; H01L 27/14607; H01L 27/14636; H01L 27/146; H01L 31/0224; H01L 31/09; H01L 31/02016

USPC .............. 250/214 R, 208.2, 214.1, 208.6; 257/257, 258, 290, 291, 431, 443, 448, 257/459, 453, 449, 457
See application file for complete search history.

(56) References Cited

U.S. PATENT DOCUMENTS 2,836,766 A * 5/1958 Halsted .................. 315/151
3,659,149 A * 4/1972 Fleming ................. 315/153
(Continued)

FOREIGN PATENT DOCUMENTS

EP 0063422 A 10/1982
EP 0613182 A2 8/1994
(Continued)

OTHER PUBLICATIONS

Bowers, John E. and Burrus, Jr., Charles A., "Ultrawide-Band Long-Wavelength p-i-n Photodetectors," Oct. 1987, Journal of Lightwave Technology, vol. LT-5, No. 10, p. 1339-1350.
(Continued)

*Primary Examiner* — Pascal M Bui Pho
*Assistant Examiner* — Jennifer Bennett
(74) *Attorney, Agent, or Firm* — Vincent J. Allen; Austin C. Teng; Carstens & Cahoon, LLP

(57) ABSTRACT

The invention discloses a photo detector with first and second groups of electrodes. The electrodes of each group are connected to a first common conductor for the group, and are located on a layer of photosensitive material. The electrodes are parallel to and interlaced with each other. The first common conductors are essentially plane, arranged at the same end of their group of electrodes, and arranged as upper and lower conductors parallel to and overlapping each other separated by a dielectric material, and form a signal electrode and a ground plane of a first microstrip line. The first microstrip line acts as a first combiner for currents induced in the electrodes of the two groups and as a matching network for the electrodes and for a load which can be connected to the photo detector.

11 Claims, 5 Drawing Sheets

(51) Int. Cl.
*H01L 31/0224* (2006.01)
*H01L 31/02* (2006.01)
*H01L 31/09* (2006.01)

(56) References Cited

U.S. PATENT DOCUMENTS

| | | | |
|---|---|---|---|
| 4,593,304 A * | 6/1986 | Slayman et al. | 257/457 |
| 4,716,403 A * | 12/1987 | Morozumi | 345/88 |
| 5,270,532 A | 12/1993 | Hietala et al. | |
| 5,404,006 A * | 4/1995 | Schaffner et al. | 250/208.2 |
| 5,572,014 A | 11/1996 | Wu et al. | |
| 5,581,094 A * | 12/1996 | Hara et al. | 257/80 |
| 6,051,827 A * | 4/2000 | Mei et al. | 250/214 R |
| 6,239,422 B1 | 5/2001 | Vang et al. | |
| 6,403,990 B1 * | 6/2002 | Kaneko et al. | 257/184 |
| 7,692,258 B2 * | 4/2010 | Reshotko et al. | 257/428 |
| 2008/0013026 A1 * | 1/2008 | Choi et al. | 349/139 |

FOREIGN PATENT DOCUMENTS

| | | |
|---|---|---|
| EP | 1049177 A2 | 2/2000 |
| GB | 2253480 A | 9/1992 |
| WO | 03/090384 A1 | 10/2003 |
| WO | 2005/031289 A1 | 4/2005 |

OTHER PUBLICATIONS

Bozzi et al., "Development of Microwave and Millimeter-Wave Traveling-Wave Electro-Optical Devices Using Substrate Integrated Circuit Concept", copyright 2007, IEEE, Doc. No. 1-4244-1168-8/07.

International Search Report with Written Opinion, Application No. PCT/EP2008/065342, Feb. 24, 2009.

Kato, Kazutoshi, Ultrawide-Band/High-Frequency Photodetectors, Jul. 1999, IEEE Transactions on Microwave Theory and Techniques, vol. 47, No. 7, p. 1265-1281.

Ke Wu et al: "Development of microwave and millimeter-wave traveling-wave electro-optical devices using substrate integrated circuit concept" 2007 International Topical Meeting Microwave Photonics Oct. 3-5, 2007 Victoria, BC, Canada, 2007, pp. 62-65, XP002514824.

Rogers, Dennis L., "Integrated Optical Receivers using MSM Detectors," Dec. 1991, Journal of Lightwave Technology, vol. 19, No. 12, p. 1635-1638.

Decorby R et al: "Broadband impedance-matched metal-semi conductor-metal photodetector arrays" 1998 International Conference on Applications of Photonic Technology III: Closing the Gap Between Theory, Development, and Applications Jul. 29-31, 1998 Ottawa, Ont., Canada, vol. 3491, Dec. 4, 1998, XP002514823 Proceedings of the SPIE—The International Society for Optical Engineering SPIE—Int. Soc. Opt. Eng USA; ISSN: 0277-786X.

* cited by examiner

SCALABLE LARGE AREA PHOTO DETECTOR WITH ASYMMETRIC MICROSTRIP TRANSITION

TECHNICAL FIELD

The present invention discloses a photo detector with a first and a second group of thin elongated electrodes. The electrodes of each group are connected to a first common conductor for the group and are located on or in a layer of photosensitive material.

BACKGROUND

So called large aperture photo detectors are a known technology, which typically use a number of DC-biased electrode "fingers" arranged on a photosensitive surface. Such known photo detectors have a limitation on their function due to their RC-factor.

SUMMARY

It is an object of the present invention to obtain a large aperture photo detector which does not have the drawbacks of such known photo detectors.

This object is achieved by the present invention in that it discloses a photo detector which comprises a first and a second group of thin elongated electrodes in which the electrodes of each group are connected to a first common conductor for the group.

In addition, the electrodes are located on or in a layer of photosensitive material, and are arranged so that they are essentially parallel to each other and interlaced with each other so that each electrode of one of the groups is immediately adjacent to one or more electrode of the other group.

According to the invention, the first common conductors are essentially plane and are arranged as an upper and a lower conductor which are essentially parallel to each other and overlap each other at least in part, separated by a dielectric material.

Due to this design of the first common conductors, they form the signal electrode and the ground plane of a first microstrip line, which acts as a first combiner for currents induced in the electrodes of the two groups and also as a first matching network for the electrodes and a load which can be connected to the photo detector.

Due to the design of the first microstrip line, a so called travelling wave effect is obtained in the electrodes, which will serve to reduce or entirely eliminate the negative effects of the RC constant in known large aperture photo detectors.

Suitably, the photo detector of the invention also comprises connections for creating a bias voltage between the two groups of electrodes.

In one embodiment, the photo detector of the invention also comprises a second common conductor for each group of electrodes, and the first and the second common conductors of each group of electrodes are arranged at opposite distal ends of the electrodes. The second common conductors of each group are essentially plane and are arranged as an upper and a lower conductor, essentially parallel to each other and overlap each other at least in part, separated by a dielectric material, so that the two second common conductors form the signal electrode and the ground plane of a second microstrip line. In this embodiment, the second microstrip line acts as a second combiner for currents induced in the electrodes of the two groups and as a second matching network for the electrodes and for a load which can be connected to the photo detector.

Suitably, in the embodiment with two combiners, one of the combiners also comprises a load which is adapted to match the impedance of the photo detector These and other embodiments and their advantages will be explained in more detail in the following sections.

BRIEF DESCRIPTION OF THE DRAWINGS

The invention will be described in more detail in the following, with reference to the appended drawings, in which.

DETAILED DESCRIPTION

Figure 1:
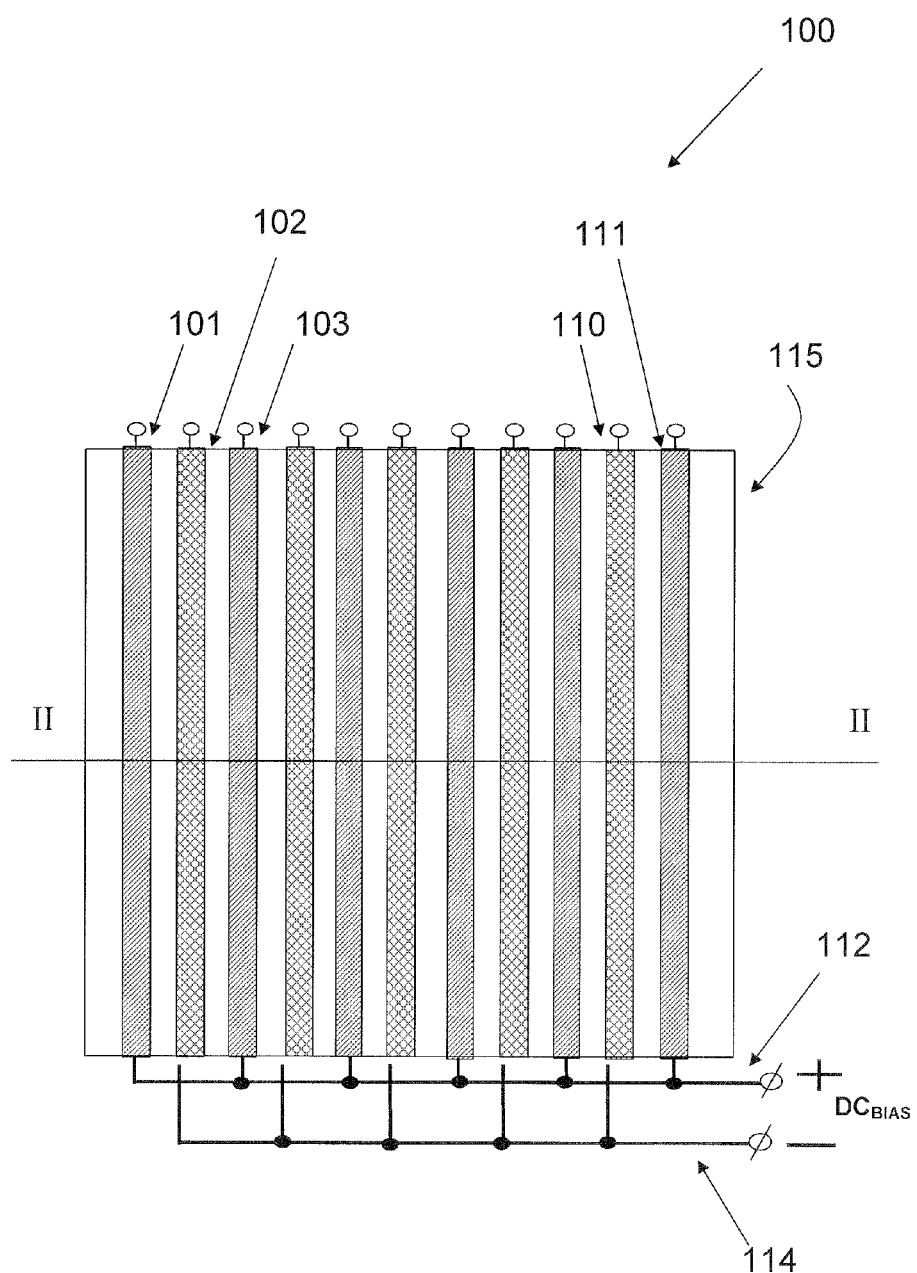
FIG. 1 shows a top view of a part of a detector of the invention.

FIG. 1 shows a top view of a part of a detector 100 of the invention. As shown in FIG. 1, the detector 100 comprises a number of elongated essentially flat electrodes 101-111, which are arranged in two groups, as indicated by the patterns in the drawing, and as is also indicated by giving the electrodes of one group even numbers, and the electrodes of the other group odd numbers. All of the electrodes in FIG. 1 have not been given reference numbers, in the interest of legibility.

As can also be seen in FIG. 1, the electrodes of the two groups are interlaced with each other, so that an electrode of one group will be immediately adjacent to one or two electrodes of the other group. This electrode pattern forms a so called multi-strip line or multi-slot line, and supports a number of guided modes, where the number of modes is equal to the number of strips.

The electrodes 101-111 are made of a conducting material such as, for example, copper, and are arranged on a layer of photosensitive material 115. Also shown in FIG. 1 is a preferred feature of the photo detector of the invention: the electrodes of each group are connected to respective leads 112, 114, for applying a DC bias voltage between the two groups of electrodes. Suitably, the leads 112, 114 are connected to the same end of the electrodes of the two groups.

Due to the way the electrodes are biased, with alternating electrodes being connected to different polarities of the biasing voltage, only one guided mode is excited, and will be able to carry an incoming signal.

Figure 2:
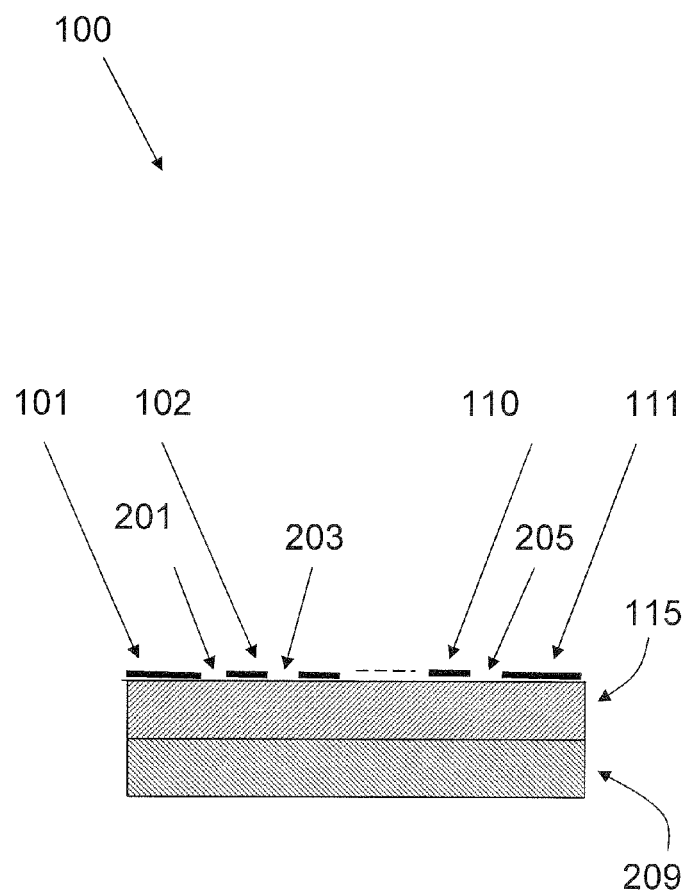
FIG. 2 shows a cross section of part of FIG. 1.

FIG. 2 is a cross sectional view of the device 100 of FIG. 1 along the line II-II in FIG. 1. As seen here, between the electrodes 101-111, there are slots, shown as 201-205 in FIG. 2. For this reason, the design is also sometimes referred to as a multi-slot design, or alternatively, depending on the method of manufacture, it is referred to as a multi-strip design. A multi-slot design may be obtained by creating slots in a metal layer, and a multi-strip design may be created by depositing electrodes of a conducting material such as copper on top of the layer of photosensitive material 115.

Also shown in FIG. 2 is a feature which in some embodiments can be present in a photo detector of the invention: a layer 209 of a supporting substrate is arranged below the layer of photosensitive material 115, in order to support the detector 100. The supporting substrate is not a feature which is necessary in order to enable the photo detector of the invention to function, but may be used in order to lend stability to the design 100. The material used for the substrate should have a high so called Q-value.

Figure 3:
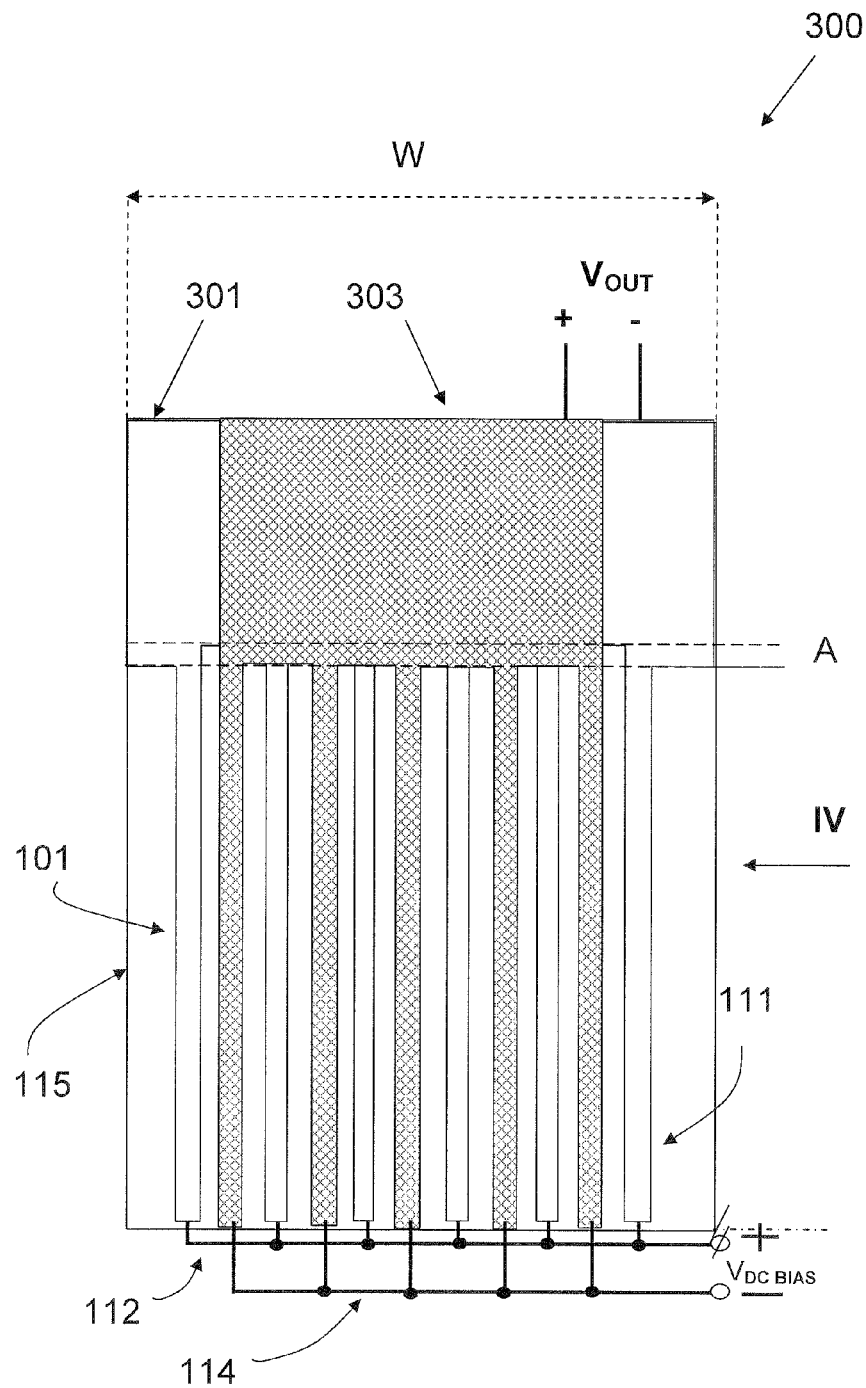
FIG. 3 shows a plan view of a first embodiment of the invention.

FIG. 3 shows a more complete plan view of a photo detector 300 of the invention. As shown in FIG. 3, each of the two groups of electrodes (the two groups being indicated by means of different patterns on the electrodes) is connected to a common conductor 301, 303. The two common conductors 301, 303 are essentially plane, and are arranged as an upper and a lower conductor which are essentially parallel to each other and overlap each other entirely or at least in part.

The two common conductors 301, 303 are separated by a layer of a dielectric material, and in this way they constitute a signal electrode and a ground plane of a microstrip line.

The microstrip line which is formed by the two common conductors 301, 303, (together with the layer of dielectric material), acts as a combiner for currents which are induced in the electrodes of the two groups when an incident light signal hits the photosensitive material 115, and also acts as a matching network which matches the impedance of the multi-strip/multi-slot line formed by the electrodes 101-111 to that of an external load which can be connected to the photo detector.

Suitably but not necessarily, the two common conductors 301, 303 which form the conducting parts of the microstrip line are of the same width, i.e. they overlap each other entirely. Their common width is indicated as "W" in FIG. 3, in which parts of the upper conductor 303 and the intermediate dielectric material have been removed in order to better show the design.

In addition, regarding the width of the electrodes 101-111, the following can be said: narrowing the width of the electrodes will decrease the amount of "screening" of the photo conducting material from an incident light wave, but using narrow electrodes will also increase the conductor losses, so the width will be a trade-off between these two factors, i.e. screening and losses.

FIG. 3 also shows the connections 112, 114, for creating a DC bias voltage between the two groups of electrodes in the detector 300.

Figure 4:
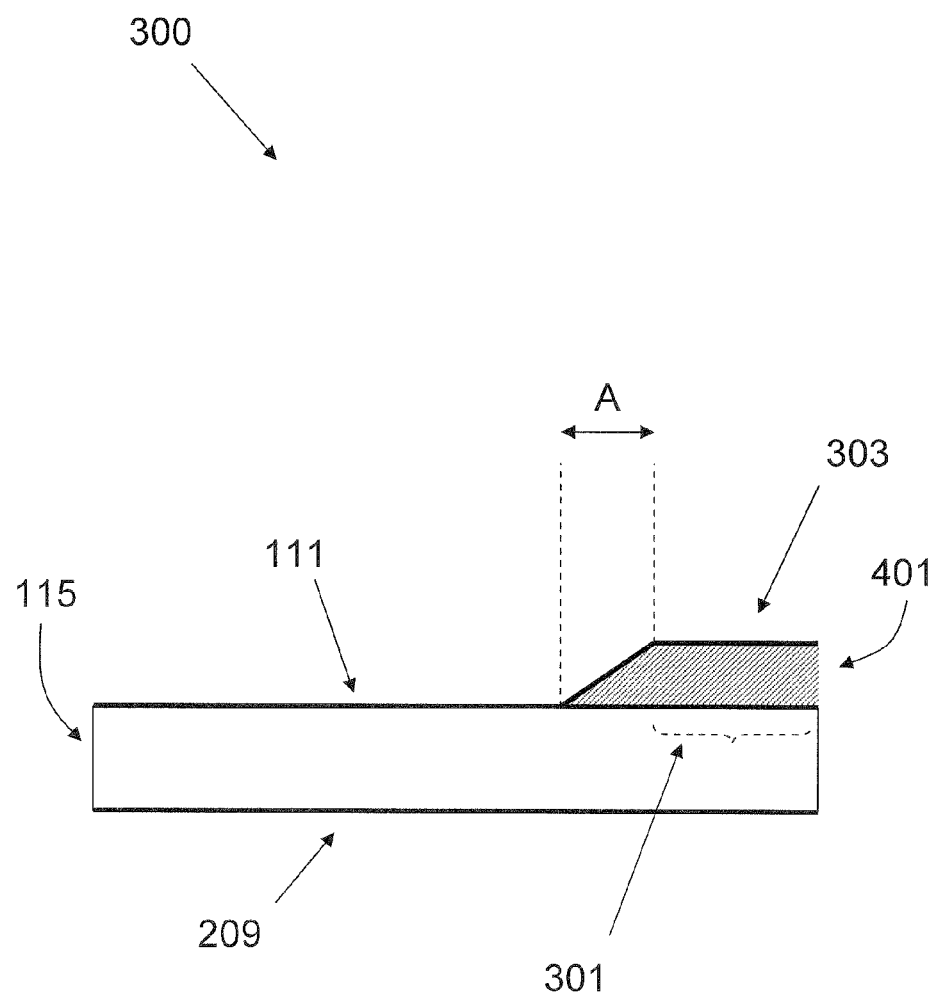
FIG. 4 shows a side view of the embodiment of FIG. 3.

FIG. 4 shows the photo detector 300 of FIG. 3 in a side view from the point indicated by an arrow "IV" in FIG. 3. In this side view, the upper 303 and the lower 301 planes of the microstrip line can be seen, as well as the layer 401 of a dielectric material which separates these two planes.

The layer of photosensitive material 115 is also shown, as is the supporting substrate 209 which, as explained can be used in some applications.

As is more clearly shown in FIG. 4, the photo detector 300 comprises a connection from the upper plane 303 to the electrodes of one of the two groups of electrodes. This connection is a slanted part shown as "A" in FIG. 4. Also shown in the side view of the photo detector 300 is the "rightmost" electrode 111 of FIG. 3.

The design of the invention, as described above and as shown in FIGS. 3 and 4, discloses a novel transition between a multi strip/multi slot design and microstrip lines, with the transition also acting as a matching network and combiner, as described above.

As mentioned, the electrodes and the micro strip parts of the photo detector of the invention should be made of a conducting material such as, for example, copper. Regarding the choice of material for the dielectric layer 401, a suitable choice of material is so called BCB, benzocyclobutene, but other dielectric materials are also possible.

When choosing the material for the dielectric layer, an important factor is the dielectric constant, $\in$, of the material. Since different dielectric materials have different dielectric constants, the choice of material will include the thickness of the layer of dielectric material.

The thickness, i.e. the distance between the two layers 301, 303, of the microstrip line, should be chosen so that the impedance of the resulting microstrip line, which preferably has a width W which is equal to that of the multi-slot/multi line structure, is equal to the slot modal impedances of the slots connected in parallel.

Since the slot impedances are close to each other, the impedance of all of the slots connected in parallel is proportional to 1/N (where N is the number of slots) or to 1/w, where w is the width of the multi slot line, which is also true for the impedance of the microstrip line. Hence, increasing the number of the slots or electrodes does not require adjustments in the thickness of the dielectric layer, which is an important for the "scalability" of the photo detector of the invention, since it means that the size of the aperture or area of the photo detector can be varied without varying this basic design parameters of the strip line part of the photo detector.

In one embodiment 500 of the photo detector of the invention, there are two combiners and matching networks ("CMN") of the design shown in FIGS. 3 and 4 and described above. These two combiners and matching networks are shown as 511 and 512 in FIG. 5, and are, as shown in FIG. 5, arranged at opposite distal ends of the multi-slot/multi-strip part 513 of the photo detector 500.

One of the CMNs, 512, is shown as having connections for an output voltage, "$V_{OUT}$", where an external device such as, for example, an amplifier may be connected, while the other CMN, 511, is shown as having a dummy load 510 connected to it. In this particular case, the dummy load comprises a capacitor C connected in series with a resistor R, although other configurations of the dummy load 510 are also possible, as is well known to those skilled in the art.

The role of the dummy load 610 is to increase the bandwidth of the photo detector 500. The dummy load should have an impedance which is equal to that of the photo detector "as such", which is indicated in FIG. 5 by means of showing two points where the impedances Z1 and Z2 should be equal to each other, as seen looking in the direction of the arrows.

Figure 5:
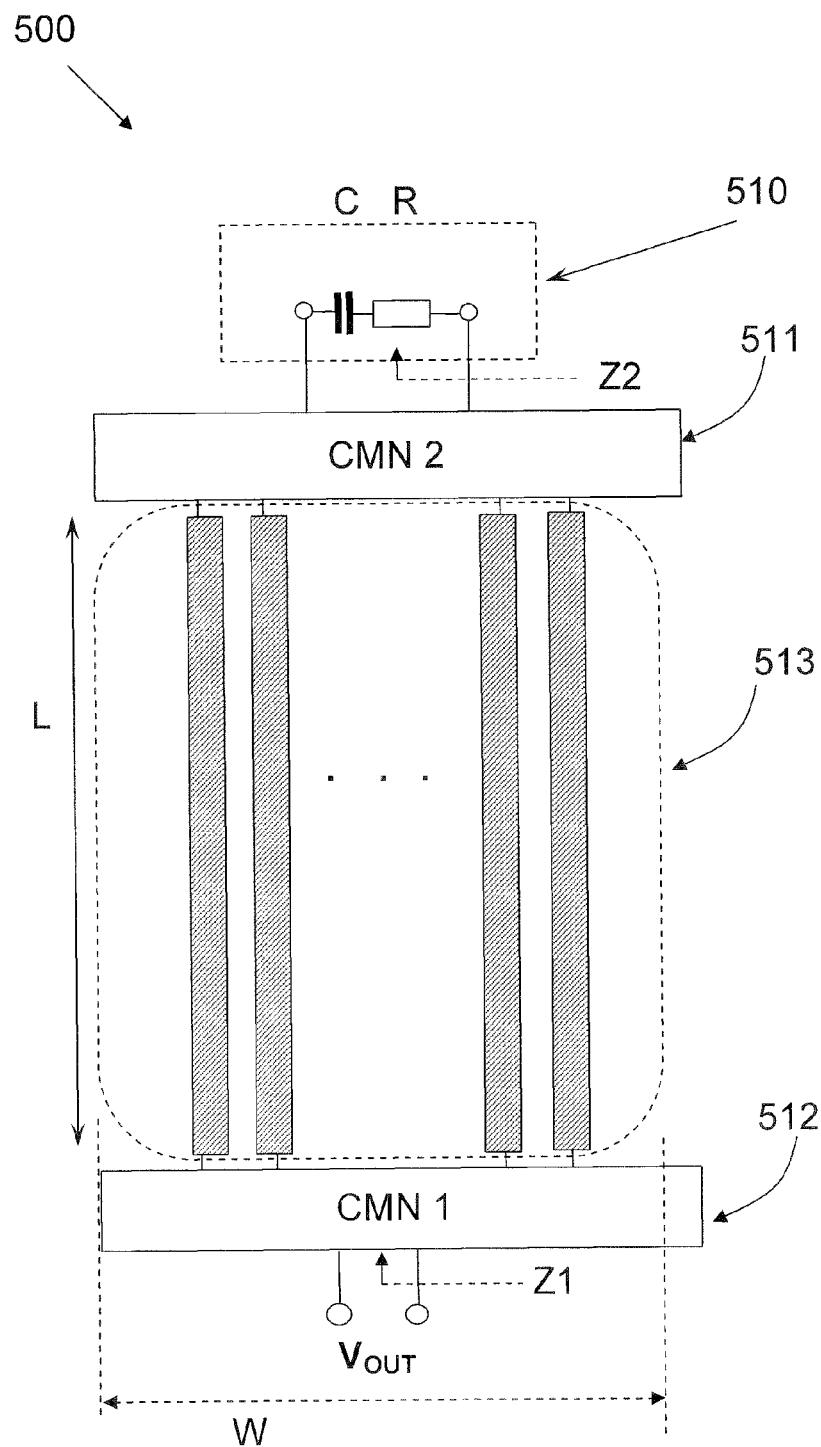
FIG. 5 shows a schematic plan view of a second embodiment of the invention.

Thus, there are at least two embodiments of the present invention: in one embodiment 300, as shown in FIG. 3, the photo detector of the invention comprises one combiner and matching network, which is placed at one end of the multi-slot/multi-strip design, while in a second embodiment 500, as shown in FIG. 5, there are two combining and matching networks, placed at opposite distal ends of the multi-slot/multi-strip design.

In the embodiment 500 with two combining and matching networks, one of the networks should, as shown in FIG. 5 and as also described above, be connected to a "dummy load" 510.

Regarding which of these two embodiments, one or two combining and matching networks, "CMN", which should be chosen for a particular application, the following principles can be used:

If the embodiment with one CMN is chosen, no dummy load will be used, which will cause the photo detector to have a reduced bandwidth as compared to the embodiment with two CMNs. However, the efficiency (i.e. the quantum efficiency) of the one CMN embodiment will be twice that of the "two CMN" embodiment.

Conversely, the "two CMN" embodiment will have the advantage of a bandwidth which is twice that of the "one CMN" embodiment, while the efficiency of the photo detector, (i.e. the quantum efficiency) is reduced by a factor of two as compared to the "one CMN" embodiment.

Bearing these considerations in mind, either embodiment can be chosen, depending on the requirements of the particular application of the photo detector.

The invention is not limited to the examples of embodiment described above and shown in the drawings, but may be freely varied within the scope of the appended patent claims.

We claim:

1. A photo detector, comprising:
   a first group of thin elongated electrodes formed on or in a layer of photosensitive material;
   a second group of thin elongated electrodes formed on or in the layer of photosensitive material, the second group being oriented such that the electrodes of the first group form an interlacing pattern with the electrodes of the second group;
   a first microstrip line, comprising:
      a first common conductor connected to the first group, the first common conductor forming a signal electrode layer;
      a second common conductor connected to the second group, the second common conductor forming a ground plane layer; and
      a dielectric layer separating the signal electrode layer from the ground plane layer; and
   a second microstrip line arranged at opposite distal ends of the electrodes of the first microstrip line, comprising:
      a third common conductor connected to the first group, the third common conductor forming a first conductive layer;
      a fourth common conductor connected to the second group, the fourth common conductor forming a second conductive layer; and
      a dielectric layer separating the first conductive layer from the second conductive layer.

2. The photo detector of claim 1 wherein the first microstrip line acts as a combiner for currents induced in the electrodes of the first group and the second group.

3. The photo detector of claim 1 wherein the first microstrip line acts as a matching network for the electrodes of the first group and the second group.

4. The photo detector of claim 1 wherein the first microstrip line is configured to connect to an external load.

5. The photo detector of claim 1, further comprising:
   a plurality of connections for creating a DC bias voltage between the electrodes of the first group and the second group.

6. The photo detector of claim 1 wherein the first microstrip line acts as a first combiner for currents induced in the electrodes of the first group and the second group, and the second microstrip line acts as a second combiner for currents induced in the electrodes of the first group and the second group.

7. The photo detector of claim 1 wherein the first microstrip line acts as a matching network for the electrodes of the first group and the second group, and the second microstrip line act as a second matching network for the electrodes of the first group and the second group.

8. The photo detector of claim 1, further comprising:
   a dummy load connected to the second microstrip line, the dummy load configured to match the impedance of the photo detector.

9. A photo detector comprising:
   a first and a second group of thin elongated electrodes, with the electrodes of each of said group being connected to a common conductor for each said group, said electrodes being located on or in a layer of photosensitive material, said groups of electrodes being essentially parallel to each other and interlaced with each other so that each electrode of one of said groups is immediately adjacent to one or more electrodes of the other of said groups, each common conductor lying in parallel planes separated by a dielectric layer, arranged at the same end of their respective group of thin elongated electrodes, and arranged as an upper and a lower conductor which are essentially parallel to each other and overlap each other at least in part, so that the common conductors form a signal electrode and a ground plane, of a first microstrip line, with the first microstrip line acting as a first combiner for currents induced in the electrodes of the two groups and as a first matching network for the electrodes and operable to be connected to a load, and
   a third and a fourth common conductor for said groups of electrodes arranged at distal ends of the electrodes extending from the first microstrip, said third and fourth common conductors lying in parallel planes separated by a dielectric layer, and arranged as an upper and a lower conductor, parallel to each other and overlapping each other at least in part, so that the third and fourth common conductors form a conductor and a ground plane of a second microstrip line, with the second microstrip line acting as a second combiner for currents induced in the electrodes of the two groups and as a second matching network for the electrodes.

10. The photo detector of claim 9, additionally comprising connections (DC BIAS) for creating a bias voltage between the two groups of electrodes.

11. The photo detector of claim 9, in which the second combiner comprises a load which is adapted to match the impedance of the photo detector.

\* \* \* \* \*